United States Patent
Wright

(10) Patent No.: US 9,470,264 B2
(45) Date of Patent: Oct. 18, 2016

(54) MAGNETIC BEARING DRIVE CIRCUIT

(75) Inventor: Derek Thomas Wright, West Sussex (GB)

(73) Assignee: WAUKESHA BEARINGS LIMITED, Middlesex (GB)

( * ) Notice: Subject to any disclaimer, the term of this patent is extended or adjusted under 35 U.S.C. 154(b) by 592 days.

(21) Appl. No.: 13/995,608

(22) PCT Filed: Dec. 15, 2011

(86) PCT No.: PCT/GB2011/052482
§ 371 (c)(1),
(2), (4) Date: Jun. 19, 2013

(87) PCT Pub. No.: WO2012/085540
PCT Pub. Date: Jun. 28, 2012

(65) Prior Publication Data
US 2013/0270946 A1    Oct. 17, 2013

(30) Foreign Application Priority Data

Dec. 22, 2010    (GB) .................................. 1021714.9

(51) Int. Cl.
*F16C 32/04* (2006.01)
*H03F 3/217* (2006.01)

(52) U.S. Cl.
CPC ....... *F16C 32/0451* (2013.01); *F16C 32/0457* (2013.01); *H03F 3/217* (2013.01)

(58) Field of Classification Search
CPC .... H03F 3/217; F16C 32/04; F16C 32/0451; F16C 32/0457
USPC ........................................................ 318/376
See application file for complete search history.

(56) References Cited

U.S. PATENT DOCUMENTS

| 4,061,948 | A  | 12/1977 | Lamparter |
| 5,376,867 | A  | 12/1994 | Capetti |
| 5,446,445 | A  | 8/1995 | Bloomfield et al. |
| 7,928,620 | B2 | 4/2011 | Denk et al. |
| 2009/0174270 | A1 | 7/2009 | Denk et al. |

FOREIGN PATENT DOCUMENTS

| GB | 2255700 | 11/1992 |
| JP | 2009536009 | 10/2009 |
| RU | 2117410 | 8/1998 |
| RU | 2134908 | 8/1999 |

OTHER PUBLICATIONS

Decision on Grant for Russian Patent Application No. 2013134154, mailed on Jun. 18, 2014, 18 pages, including 7 pages of English translation.

(Continued)

*Primary Examiner* — Jeffrey Donels
(74) *Attorney, Agent, or Firm* — Shichrur & Co.

(57) ABSTRACT

There is provided a magnetic bearing drive circuit driven from a pair of Direct Current (DC) link voltage rails, said magnetic bearing drive circuit having at least one amplifier providing an output PWM drive signal for driving a magnetic bearing winding, said output PWM drive signal being provided to the magnetic bearing winding through a plurality of drive signal rails, said magnetic bearing drive circuit comprising a pair of voltage offset devices coupled to the DC link voltage rails and arranged to provide a pair of offset catcher voltage rails from the DC link voltage rails, and primary clamping means coupled between each offset catcher voltage rail and a respective one of the drive signal rails.

12 Claims, 6 Drawing Sheets

(56) References Cited

OTHER PUBLICATIONS

Office Action for Japanese Patent Application No. 2013-545492, mailed on Jul. 1, 2014, 4 pages, including 2 pages of English translation.

International Search Report for PCT/GB2011/052482, mailed on Jun. 4, 2012; 5 pages.

International Preliminary Report on Patentability for PCT/GB2011/052482, mailed on Jul. 4, 2013; 8 pages.

Middlebrook, R.D. "Origins of Harmonic Distortion in Switching Amplifiers", Proc. 4th Annual International PCI Conference 1982, San Fransisco, CA, Mar. 31, 1982, XP002675969; 16 pages.

NORMAL ZENER

POWER ZENER

VARIABLE POWER ZENER (1)

MAGNETIC BEARING DRIVE CIRCUIT

CROSS REFERENCE

This application is a National Phase Application of PCT International Application No. PCT/GB2011/052482, International Filing Date Dec. 15, 2011, which in turn claims priority from and the benefit of Great Britain Patent Application Serial No. 1021714.9, filed Dec. 22, 2010, the entire disclosures of all of which are incorporated herein by reference.

FIELD OF THE INVENTION

This invention relates to power electronics in general, and in particular to an improved magnetic bearing drive system.

BACKGROUND OF THE INVENTION

A conventional magnetic bearing amplifier is similar in topology to that used for a switched reluctance drive. However, the magnetic bearing amplifier situation differs in that the power transmitted will be ideally reactive (since no mechanical work is being done).

In practice, the magnet can be modelled as an inductor with copper losses and maybe even core losses. However, in installations with long power cables going to the magnetic bearings (which is often the case in real life implementations, since separation between the machinery containing the bearings and the bearings driver circuitry is often required, e.g. where the bearing is in a volatile gas compressor), the capacitance and transmission line effects of the long magnet power cables going to and from the magnetic bearings and their respective driver circuitry will result in high currents at the switching edges and very high voltages at the load (i.e. at the magnetic bearing).

High currents might cause damage or other detrimental effects to the bearings or driver circuitry. The detrimental effects may also be amplified, which is a particular problem because the operating voltages for such magnetic bearings are (already) typically in the order of several hundred volts (e.g. 600V).

Accordingly, there is a need for an improved magnetic bearing drive system.

SUMMARY OF THE INVENTION

Embodiments of the present invention feed the energy associated with the switching of the transmission-line-modelled magnet-power-cables back into the DC link (i.e. power supply) of the magnet drive amplifier and will limit the voltage at the load without compromising the dynamic performance of the bearing driver amplifier.

Accordingly, there is provided a magnetic bearing drive circuit driven from a pair of Direct Current (DC) link voltage rails, said magnetic bearing drive circuit having at least one amplifier providing an output PWM drive signal for driving a magnetic bearing winding, said output PWM drive signal being provided to the magnetic bearing winding through a plurality of drive signal rails, said magnetic bearing drive circuit comprising a pair of voltage offset devices coupled to the DC link voltage rails and arranged to provide a pair of offset catcher voltage rails from the DC link voltage rails, and primary clamping means coupled between each offset catcher voltage rail and a respective one of the drive signal rails. Thus, both catcher rails are connected to each "leg" of the magnetic bearing through the primary clamping means.

Optionally, each voltage offset device further comprises a decoupling capacitor network connected between earth and each offset catcher voltage rail.

Optionally, the primary clamping means comprises a pair of clamping diodes per respective drive signal rail.

Optionally, the pair of primary clamping diodes are coupled in series between the offset catcher voltage rails, and the junction between the primary clamping diodes is coupled to the respective drive signal rail.

Optionally, the voltage offset device comprises one out of: a series resistor coupled between the respective DC link voltage rail and offset catcher voltage rail; a (power) Zener diode having a predetermined threshold voltage coupled between the respective DC link voltage rail and offset catcher voltage rail; a DC-DC converter, whose output is the DC link voltage between the DC link voltage rails and whose input is a predetermined offset voltage, coupled between the respective DC link voltage rail and both offset catcher voltage rails; or a capacitor, resistor and switch forming a brake circuit.

Optionally, the voltage offset device comprises a (power) Zener diode, and the circuit further comprises a resistor in series with each Zener diode.

Optionally, the voltage offset device comprises a power Zener diode formed from a low power Zener diode coupled across a power MOSFET or power IGBT.

Optionally, the power Zener diode comprises a plurality of low power Zener diodes selectively coupled across a power MOSFET or power IGBT, to provide a variable threshold voltage power Zener diode.

Optionally, rectifier diodes may be coupled between the voltage offset devices and the DC link voltage rails to ensure power only transfers back to the DC link voltage.

Optionally, the voltage offset devices are positioned at either the amplifier end of the overall system comprising the magnetic bearing, magnetic bearing amplifier and length of cables there between, or at the magnetic bearing end of the overall system comprising the magnetic bearing, magnetic bearing amplifier and length of cables there between.

Optionally, secondary clamping means may be coupled between each DC link voltage rail and drive signal rail.

Optionally, the secondary clamping means comprises a further set of (power) diodes in series with resistors coupled between each DC link voltage rail and drive signal rail.

A variation of the afore-mentioned magnetic drive bearing circuit may also be used for other machine drive circuitry.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
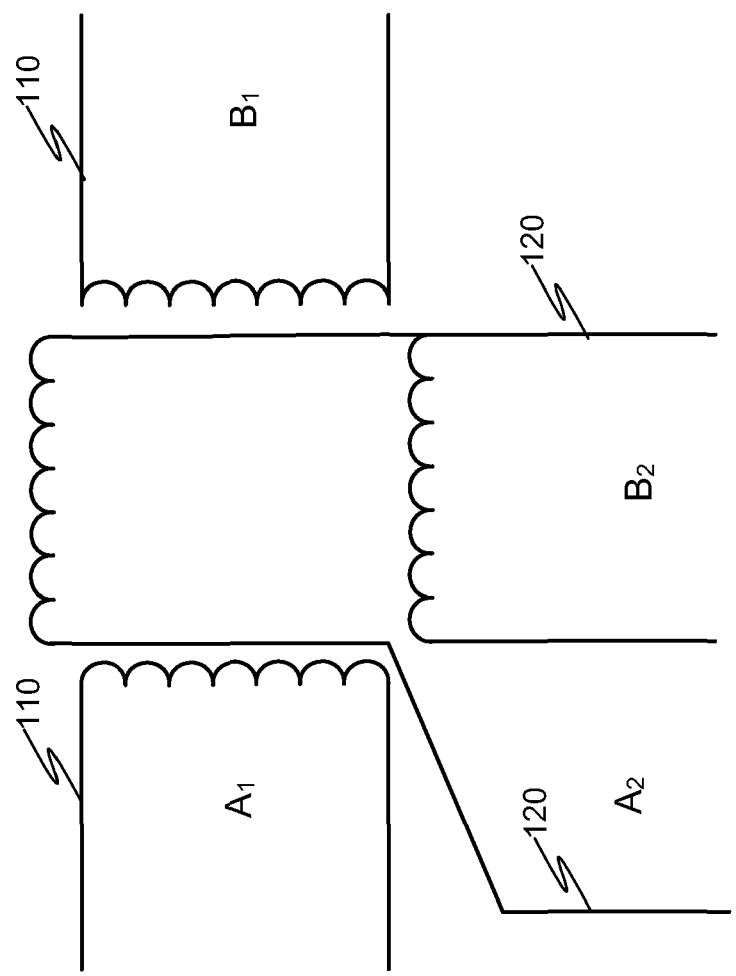
FIG. 1 schematically shows how magnetic bearing windings may be individually sourced or share a return path according to embodiments of the present invention.

Because the illustrated examples of the present invention may, for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Magnetic bearings are used in a variety of situations, most notably in plant machinery such as that found driving many industrial processes. Examples include industrial pumps, generators, and the like. Often, for safety/hygiene or others reasons, the magnetic bearings are located separately from their control and drive circuitry. The drive circuitry typically comprises multiple amplifiers powered off a suitable DC link voltage (power supply), with each amplifier providing a specifically controlled Pulse Width Modulated (PWM) drive signal to one or more sets of windings within the magnetic bearing.

Typical systems run with DC link voltages of 0V to 390 V, 0 V to 600 V or −150 V to +150V (i.e. a 300 V span centred about ground). However, the methodology of the present invention is not so limited. Different voltage spans simply require different values of resistance, breakdown/threshold voltages and the like to be used.

The PWM drive signals driving the magnetic bearing windings are often at high frequency. For such high frequency pulses, the (long) magnet power cables connecting the drive circuitry to the magnetic bearing may be treated as a transmission line.

The normal practice used to get the best pulse response or flattest frequency response out of a transmission line is to drive it from a (series) source impedance equal to the characteristic impedance of the transmission line, and terminate it with a (parallel) resistance or impedance of similar value (so called impedance matching). This eliminates reflections in the transmission line.

Taking an example of a 200 meter cable suitable for use as magnet power cabling, test measurements determine the characteristic impedance to be 43 ohms (where the tests measured the square root of the inductance per unit length divided by capacitance per unit length).

For such a cable, the high value of magnet inductance (20 mH or more) of a magnetic bearing winding effectively presents an open circuit termination at the magnetic bearing end of the magnet power cable (at the typically used 10 kHz carrier frequency of the pulse width modulation).

Simply putting a 43 ohm resistor in parallel with the magnetic bearing winding would provide a good termination (due to it matching the characteristic impedance of the transmission-line-modelled power cable), but would also incur a considerable power loss due to the significant resistance across the voltage being supplied to the respective magnet bearing winding.

For example, power loss=$V^2/R$, and where the operating voltage is 600V (which is quite typical in magnetic bearing applications), the instantaneous loss for a single magnet would be:

(600*600)/43=8372 Watts.

Taking into account that the power is being supplied to the bearing in the form of a PWM signal, the full voltage is only being applied for a proportion of time (a typical example being about 10%). This makes the power loss actually observed across the 43 Ohms resistor at the magnetic bearing end of the magnet power cables about 837 watts per magnet. However, these levels are still very high.

This power would not only have to be provided by the power supply (together with the power being used by the magnetic bearing(s) itself), but this waste power also needs to be dissipated at the load. In canned bearings the can-loss may also provide a further contribution to such resistive losses/damping.

Without the parallel termination resistor, a pulse signal arriving at the magnet end will see an impedance much higher than the Cable characteristic impedance and the voltage of the pulse transition will double as the pulse is reflected without inversion back towards the sending end.

Furthermore, it is not desirable to simply use a series resistor at the source (of 43 ohms, to match the calculated characteristic impedance of the magnet power cables in this example), because this would be about 100 times greater than the inherent cable resistance, causing unwanted, significant and unacceptable DC voltage drop in proportion to the current being transferred to the magnet winding (since power loss=$I^2R$). To put this into perspective, it is typically advisable to use a cable resistance of less than 0.5 ohms to keep the $I^2R$ power losses as low as possible. Thus, the 43 Ohm resistance would increase this total cable resistance by approx 100 times. Moreover, this topology would require a (very) high power rated resistor (which are bulky and expensive).

Furthermore, because the source impedance is effectively zero at the amplifier end, any drive signal reflected from the far end will effectively invert and bounce back (i.e. reflect) towards the magnetic bearing, to be once again reflected back toward the amplifier without inversion. This might occur regularly, resulting in a "ringing" on the line (which is particularly detrimental to amplifier circuits). In more detail, if there is an effective open circuit termination at the far end and zero impedance at the sending end, any pulse arriving at the open circuit far end will double in magnitude (e.g. to 1200V, if the original voltage was 600V) and make its way back to the sending end, only to hit a short circuit termination and travel back to the load end, now inverted, and so on. Such an effect can be demonstrated at low voltage on a video coaxial cable. The result looks like a decaying ring, but with a rectangular rather than sine waveform. The rate of decay of the ring depends upon the loss in the magnet power cable (i.e. losses through the actual series resistance of the cable compared to the 43 Ohms characteristic impedance calculated by modelling the power cables as a transmission line). Typically, the ring might decay by between 5% (magnet cable with large cross section) and 40% (video coaxial cable) for each transit up and down a long cable.

However, it was found that by catching the first voltage overshoot with a "clamping" diode connected to a voltage set slightly beyond (with respect to the voltage polarity—i.e. beyond a positive number is more positive, and beyond a negative number is more negative) the supply rail voltage of the PWM amplifier driving the magnetic bearing winding and recovering the energy from the ringing into these 'catcher' voltage rails, it is possible to substantially reduce the amplitude of any further back-and-forth ring effects in a single hit. This, in effect, is the result of terminating the excess voltage part of the reflection into an artificial near-zero impedance at the open circuit far end.

A second "clamping" diode may be used for negative transitions and in this case the catching voltage needs to be slightly beyond the negative drive voltage, i.e. more negative than the negative rail supplying power to the pulse source (i.e. the magnetic bearing drive amplifier).

Preferably, the "clamping" diodes are fast recovery diodes, and used in a pair (per leg of the bearing winding power cable).

Each magnet power cable comprises two 'legs', i.e. a current conductor going from the drive amplifier to the magnetic bearing winding and a current conductor coming back from the magnetic bearing winding to the drive amplifier. Magnetic bearing windings are often driven in opposing pairs, so a set of opposing magnets may share a single return path, i.e. leg, as shown in FIG. 1 (where $A_1$ and $B_1$ 110 represent isolated/individual magnet drive cabling and $A_2/B_2$ 120 represent a shared common return situation).

Each magnetic bearing winding/leg, (or shared return path) typically has two associated clamping diodes, so four are used per magnetic bearing winding. In one embodiment, the diodes have no series resistors and connect to the catcher voltages offset above and below the limits of the DC link voltage by a predetermined voltage offset value. However, resistors matching the impedance of the magnet power cables may be used in alternative embodiments.

Every catcher voltage (i.e. voltage sink) preferably has two decoupling capacitors, one connecting to earth and the other connecting to the opposite polarity catcher voltage. Earth is typically the local machine metalwork earth potential, not the earth conductor in the magnet cable.

Whilst a separate circuit may provide the catcher voltages, it is preferential to use the DC link voltage, so that energy is returned to the DC link, and not lost. Thus, in energy efficiency terms, it is far superior to use voltage offset devices connected back to the DC link to return power to the DC link whenever the positive drive voltage exceeds the positive potential of the DC link voltage by a predetermined offset value, and similarly for the negative drive voltage exceeding the negative potential of the DC link. Offset voltages would typically lie between 15V and 50V of the respective DC link value (e.g. between (−15V to +615V) and (−50V to +650V) for a typical DC link voltage of 600V).

Where no power return cable is provided, there is an option to use a brake resistor circuit to dissipate the power that would otherwise be returned to the source. In this case, the circuit that normally feeds to the respective power return cable would feed instead to a large value electrolytic capacitor and this capacitor would be discharged by a resistor connected across the capacitor via a semiconductor switch. The normal action for such a brake circuit is for the switch to start conducting as the voltage increases beyond a high(er) threshold value and to cease conducting once the capacitor voltage has passed below a low(er) threshold value. The hysteresis between the two voltage levels might typically be between 15 and 50V, and so both thresholds would be beyond the spread of the DC link voltage, and so it would not be necessary to use the voltage offset device to spread the clamping voltage levels outside the range of the DC link instead. However, this is an inefficient implementation, as energy is simply being dumped into the brake circuit wastefully.

Voltage offset devices are typically used in pairs, one for a positive offset to a positive catcher voltage rail and another for a negative offset to a negative catcher voltage rail. The voltage offset devices may be located at either end of the power return cable (i.e. at the drive/control circuit end or the load end).

A range of different offset devices may be used, for example, a simple resistor can be used to create a voltage offset. However, in this case the offset voltage is directly proportional to the power return current. Thus, a resistor is simple and cheap, but does not provide the best performance.

The simplest embodiment of a constant voltage offset device is a Zener diode. When driving large voltages and currents, a power Zener diode is typically used. The Zener (breakdown, i.e. threshold) voltage will be in the region of 10 V to 50V and the Zener current might be as much as 5 A. Thus, the dissipation may be up to 250 W. The power Zener diode can be implemented by connecting a typical 400 mW (i.e. low power) Zener diode across a power semiconductor such as a Metal Oxide Semiconductor Field-Effect Transistor (MOSFET) or Insulated Gate Bipolar Transistor (IGBT), to make the gate voltage some defined value less than the Collector (when using an IGBT) or Drain (when using a MOSFET) voltage. The power Zener threshold voltage is then the breakdown voltage of the standard (400 mW typically) Zener diode plus the gate threshold voltage of the power semiconductor (which may be typically between 5V and 10V). The sum is set to be in the 10V to 50V range mentioned previously.

A more complex solution is to use a DC-DC converter to achieve the voltage offset in place of the power Zener diode. Ideally, a galvanically isolated DC-DC converter would be used that has an input voltage that is the same as the threshold voltage of the power Zener diode that the DC-DC converter replaces. The output voltage is typically the DC link voltage (i.e. 0V or +600V). The input voltage may be regulated by arranging the DC-DC converter so that the converter delivers progressively more power back to the DC link bus as the voltage rises above the set value (10V to 50V). This improves power efficiency, but at the expense of more complex catcher circuitry.

Another possibility is to use a boost converter configuration (not galvanically isolated) to return the power from the offset catcher voltage to the DC link bus. In this case, the control loop of the boost converter would need to be set up to regulate the input voltage by adjusting the current taken from the input upwards as the input voltage rises above a set value.

Additionally there may be a second set of clamping diodes which have resistors approximately equal to the magnet power cable characteristic impedance connected in series with them. This second set of clamping diodes connects directly to the DC link voltage of the power return cable (not the offset catcher voltage). The presence of the resistor prevents the catcher diode from becoming the preferred path for the flywheel current and the value is chosen to properly terminate the characteristic impedance. The serial order of the secondary clamping diode and series resistor can be swapped. Addition of this second set of clamping diodes causes added complexity because two sets of power return cables will be required (one set of 'offset' return cables, and one set of 'DC link' return cables). This entails either a second power return cable (per DC link) or that the voltage offset devices are located at the load end of the cable. The small benefits of the secondary set of diodes may not justify the extra complexity, and problems associated with having the voltage offset devices located at the load end of the cable.

If a system were to use only the secondary clamping diodes (with series resistors), then the initial voltage overshoots would still be significant compared to those experienced when utilising only primary clamping diodes, since they are not so effective. But the duration of the 'rings' could be significantly reduced. Using both primary and secondary clamping diodes provides a mixture of their respective benefits.

Figure 2:
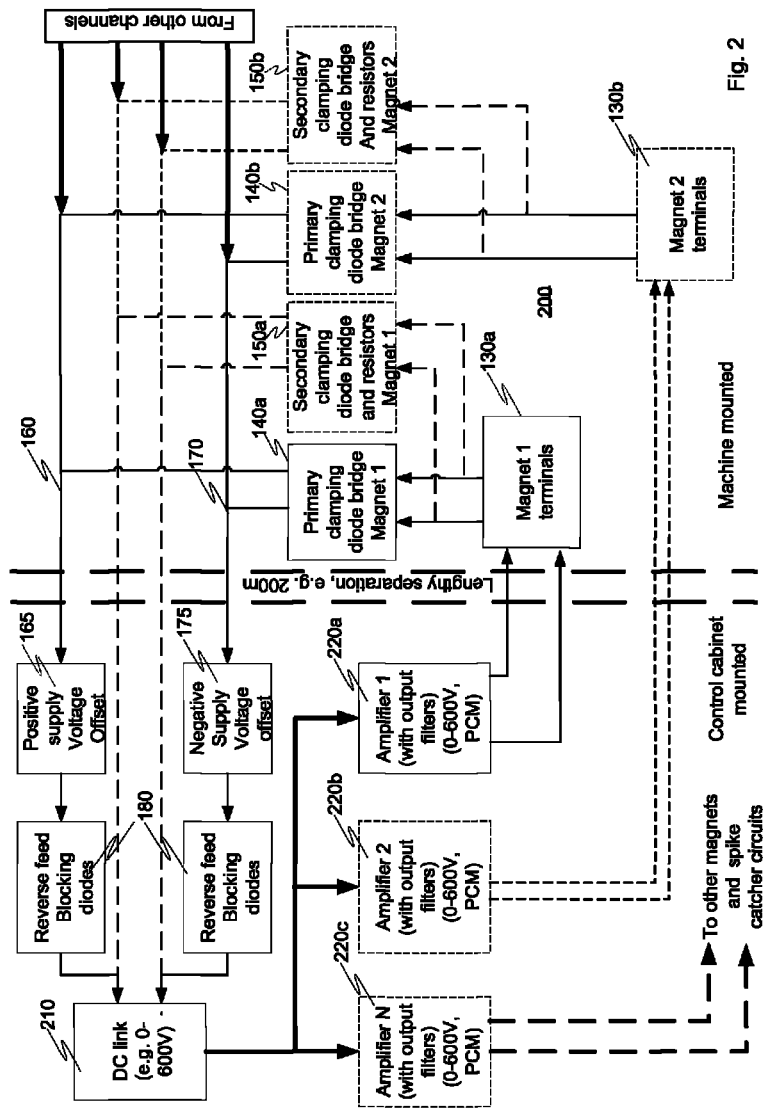
FIG. 2 shows a high level schematic diagram of a magnetic bearing amplifier circuit according to an embodiment of the present invention.

FIG. 2 shows a high level schematic diagram of a magnetic bearing amplifier circuit 200 according to an embodiment of the present invention.

In FIG. 2, a DC link voltage/power supply 210 supplies power to a plurality of magnetic bearing winding amplifiers (220a-c), each driving at least one magnetic bearing winding. The windings of the magnetic bearing are connected through respective terminals (only two sets of terminals are shown in FIG. 2—130a/b). Connected to each respective magnet terminal 130a/b are primary clamping diodes 140a/b, and, optionally, secondary clamping diodes 150a/b (dotted lines). The primary clamping diodes 140a/b are coupled between a positive catcher voltage rail 160 and a 'negative' catcher voltage rail 170, provided by respective voltage offset devices 165 and 175. These voltage offset devices, in turn, return to the appropriate DC link voltage (i.e. for a 0-600V DC link, the positive catcher rail connects to the +600V and 'negative' catcher rail connects to 0V) via reverse feed blocking diodes 180. When implemented, the secondary clamping diodes with resistors 150a/b are coupled to the DC link 210 directly. Each amplifier 220a-c has one or more sets of primary/secondary clamping diodes, and they can either all use the same power return cable, or separate ones. FIG. 2 also shows where the respective portions of the circuit are provided—either in a control cabinet located remotely to where the machine incorporating the magnetic bearing is mounted, or the machine itself.

Figure 3:
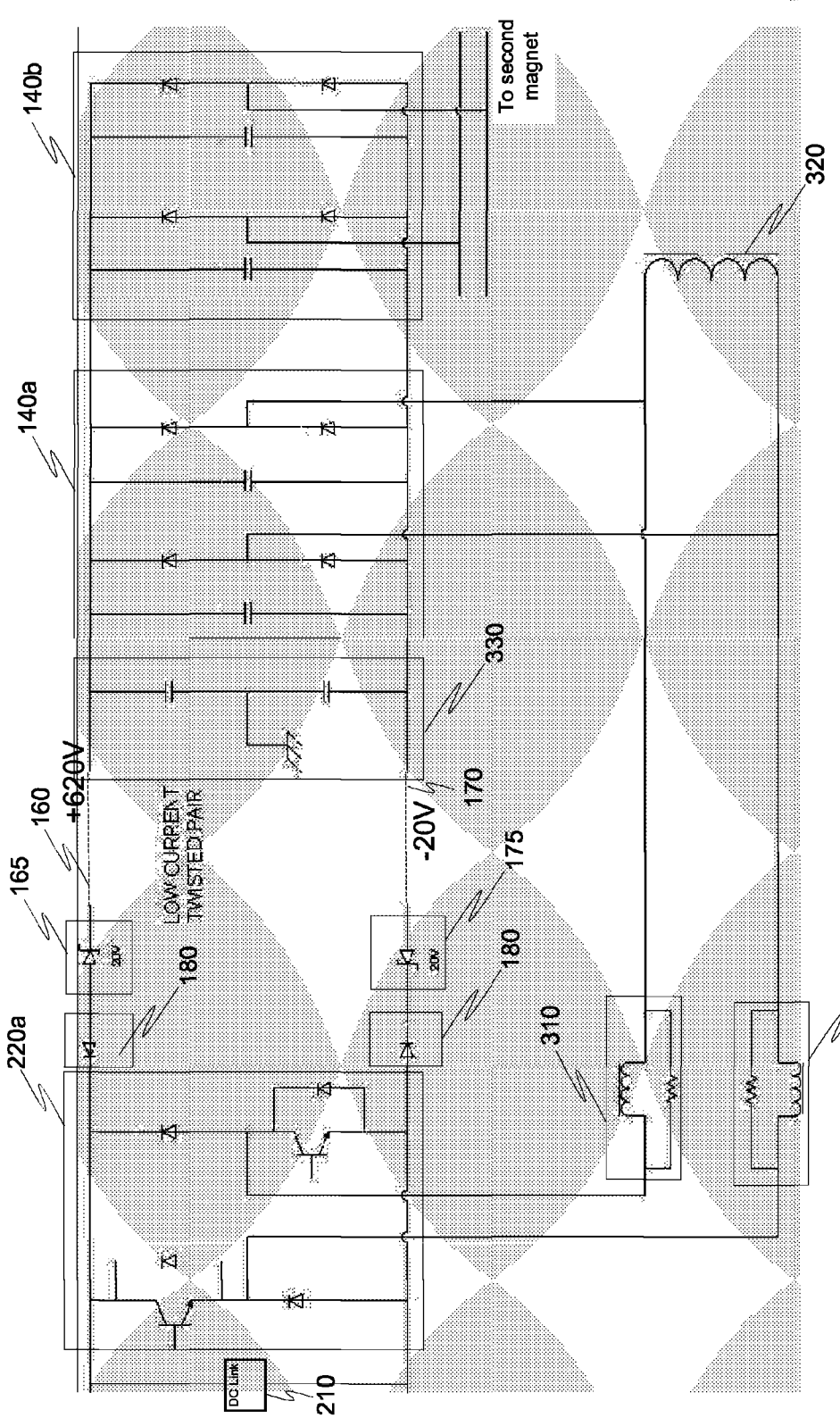
FIG. 3 shows a component level schematic diagram of a magnetic bearing amplifier circuit having only a primary clamping diode arrangement according to an embodiment of the present invention.

FIG. 3 shows a component level schematic diagram of a magnetic bearing amplifier circuit having only a primary clamping diode 140a arrangement according to an embodiment of the present invention, where the reference numerals correspond to the high level schematic diagram of FIG. 2, in order to illustrate the component typically used for the respective portions of the overall circuit. Some additional components are also shown, such as a parallel inductor and resistor in series with each cable leg 310 (these are often included to limit the rate of change of current with time under short circuit conditions), the magnetic bearing winding 320 and decoupling capacitor network 330.

Figure 4A:
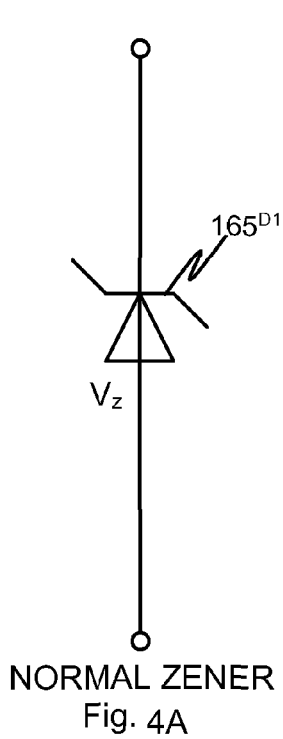
FIGS. 4A to 4C show component level schematic diagrams of a power Zener diode and variable power Zener diode, according to embodiments of the present invention.
Figure 4B:
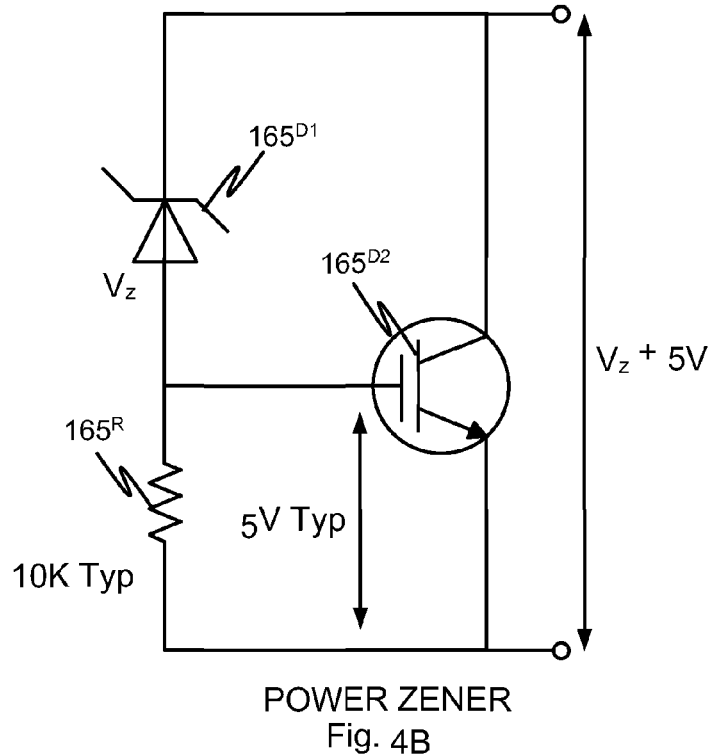
Figure 4C:
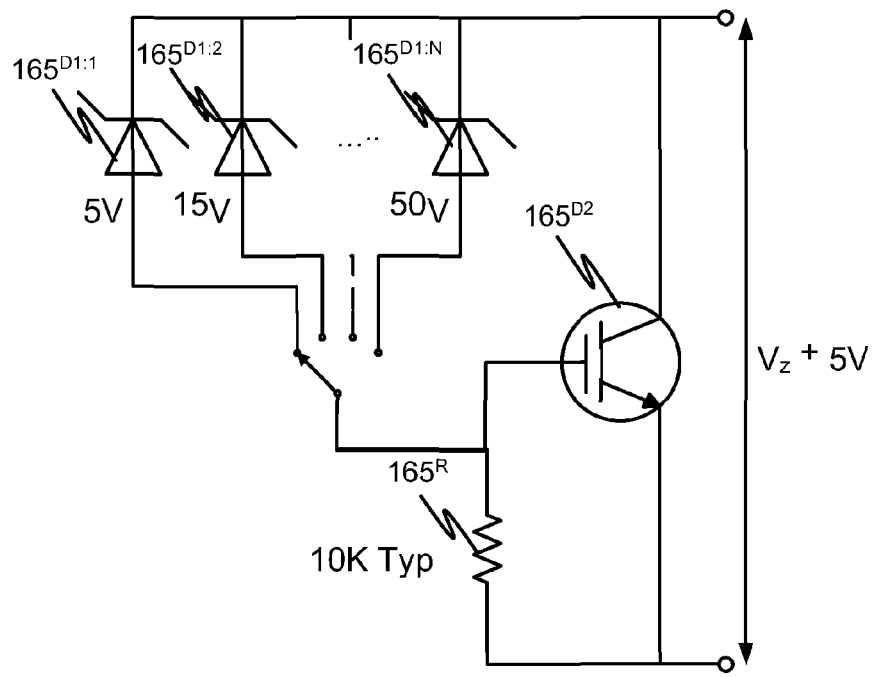

FIGS. 4A to 4C show how a power Zener diode, and variable Zener diode, may be formed from one or more low power Zener diodes ($165^{D1:1-N}$) coupled to a high powered IGBT or MOSFET transistor ($165^{D2}$), in series with a resistor ($165^R$). These arrangements may form one or more of the catcher offset voltages (positive and negative).

Figure 5:
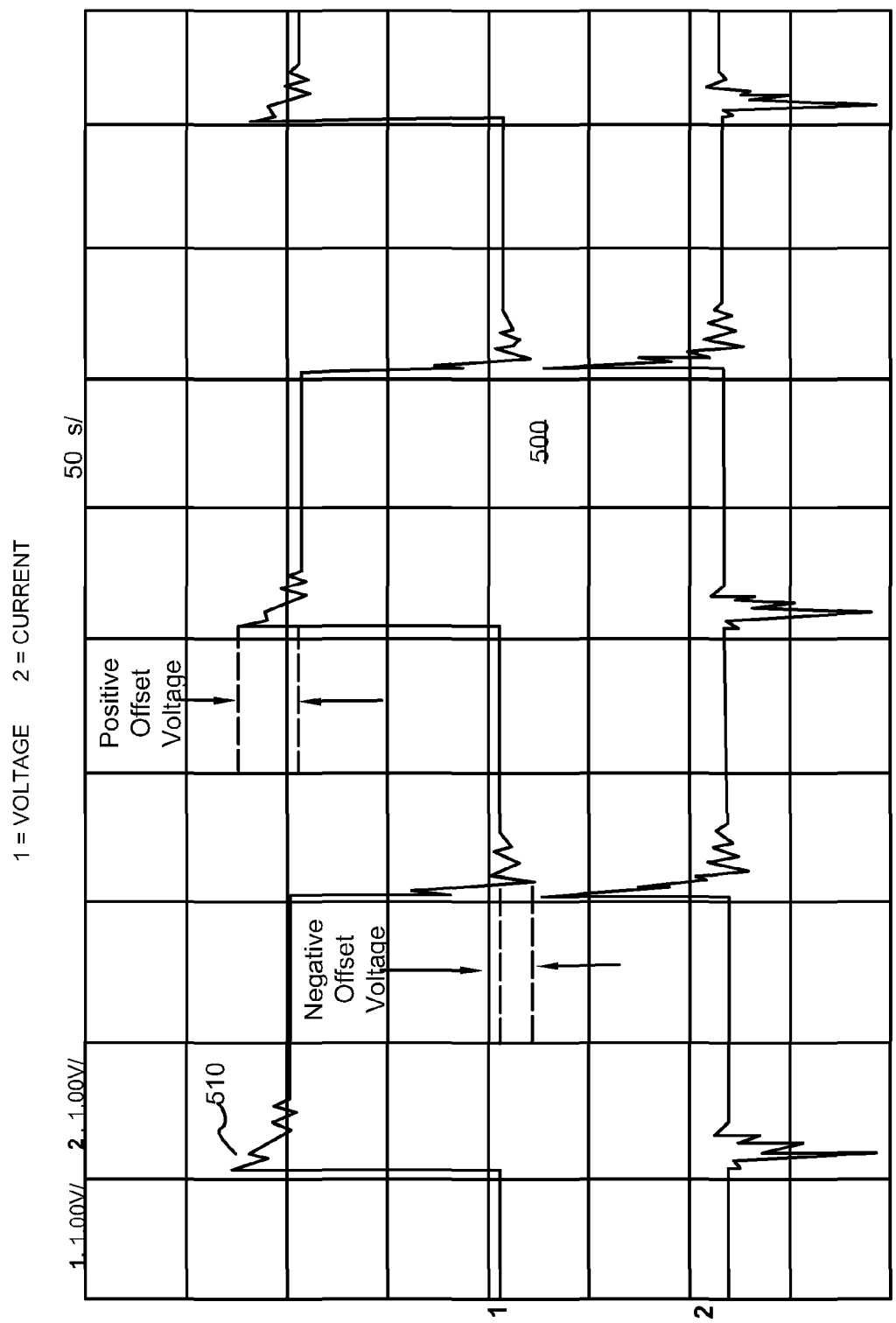
FIG. 5 shows a voltage vs time waveform of a magnetic bearing input voltage without the present invention applied.

FIG. 5 shows a voltage or current vs time waveform of a magnetic bearing input voltage without the present invention applied, where there are spikes 510 visible on the drive voltage waveform shown in the upper part of the diagram and rings on the current waveform shown in the lower half.

Figure 6:
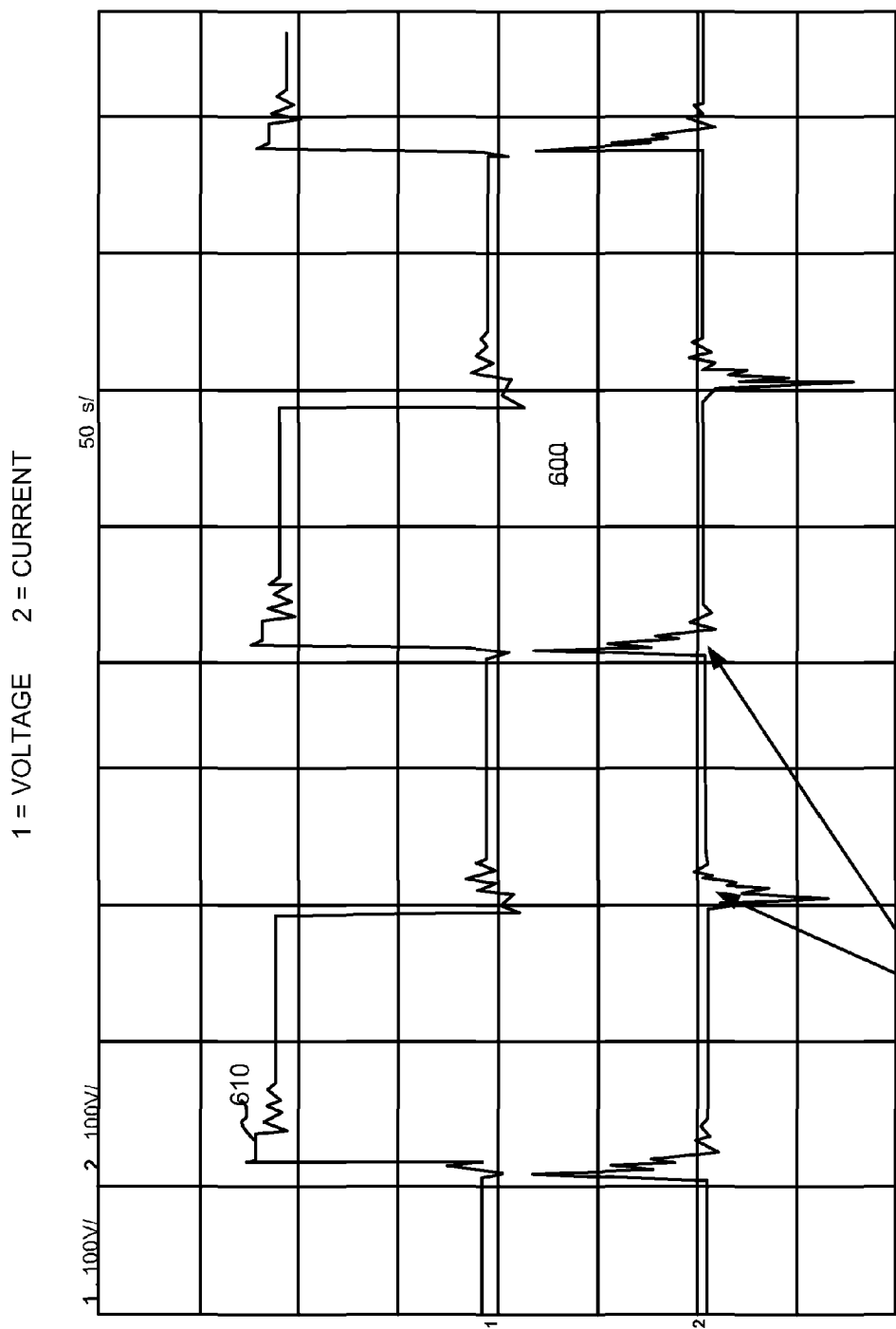
FIG. 6 shows a voltage vs time waveform of a magnetic bearing input voltage according to embodiments of the present invention.

Meanwhile, FIG. 6 shows in the upper part a voltage vs time waveform of a magnetic bearing input voltage according to embodiments of the present invention, where the spike has been removed to form a plateau 610 visible on the drive voltage waveform and in the lower half the current waveform shows a reduced duration of ring effect. It was found that if the offset catcher voltages are too small (i.e. not spread beyond the DC link voltage robustly enough), then the drive voltage has a longer tail off.

This is because it was found that if the voltage to which the "clamping" diode(s) connects is too low (i.e. too near the DC link voltage), the respective clamping diode can take over from a flywheel diode in the magnet bearing drive amplifier, causing a very long tail on the current pulse at the cable input. Under this condition the return path current is approximately half the sum of the magnet currents in the magnets to which the return path current is associated. This should be avoided by providing robust catcher voltages through suitable voltage offset devices, such as the power Zener diode arrangement of FIG. 4.

In an exemplary topology operating at 600V, it was found that by using a 22 ohm resistor in each leg of the power return to the amplifier, the current is typically reduced to around 0.7 A rather than half the sum of the magnet currents (10 A each) and from this it can be deduced that the two catcher voltages to which the Zener diodes connect are about 15V above the 600 V DC link rail and 15 V below the 0V rail. So, in effect there is tram-lining of the voltage waveform between −15V and +615V, when the pulse source was generated between 0 V and +600V. However, different component values may result in/require a different tram-lined voltage level, typically between 10V-50V.

Even with these catching voltage levels in place, there may still be some long current tails, for example when there has been a longer interval between glitches of power than the "clamping" diode(s) is able to catch and, as a result, the two tramline levels (the −15V and +615V) may move inwards towards the DC link voltages (e.g. 0V and +600V). However, this may be avoided by using a voltage offset device powered from the main DC link, such as the active power zener diode, optionally in series with a 22 Ohm resistor. By varying the Zener voltage (see FIG. 4C), the tail current and catching voltage can be optimised.

It will be appreciated that the specific component values disclosed are only exemplary and not limiting in any way. Thus, in brief review, there may be typically at least one set (pair) of clamping diodes per leg of magnet cable, with a voltage sink (offset catcher voltage) arrangement for each side (positive and negative) of the DC link. Every voltage sink may require two decoupling capacitors, one to earth and the other to the opposite polarity voltage sink. Earth is typically the local machine metalwork not the earth conductor in the magnet cable. Meanwhile, the further options for variation include: A) Clamp diodes may or may not include a series resistor; B) Possibility of using more than one set of clamp diodes (for example one set with and one set without series resistors) connected to different voltage sinks.

Different methods of providing a voltage sink may include: C1) Simple series resistor (but voltage offset from DC link varies with current flow); C2) Power Zener Diode to add a constant voltage to the DC link voltage; C3) a DC-DC Voltage converter of Zener voltage to DC link bus voltage (to reduce power wastage and avoid need to dissipate the waste heat); C4) Series resistor additional to Power Zener diode (for added safety should Zener device fail short circuit); C5) a Power dump direct into brake resistor with threshold voltage control and without power return link (but this is not so energy efficient). The voltage sink Power Zeners or DC-DC converters can be at either end of the magnet cable.

The standard rectifier diodes 180 at the amplifier end of the DC return path 180 typically only provided for safety reasons to prevent forward power flow.

There may be one DC return bus required for each separate amplifier to prevent the DC links from becoming interconnected. Worst case current rating is typically half the sum of the magnet currents (Note this is for wire self-heating considerations, as volt drop is not an issue here). A wire size of 2.5 mm² should be adequate for the power return cables. By comparison, long magnet power cables are likely to have a cross section of at least 10 mm².

The invention claimed is:

1. A magnetic bearing drive circuit driven from a pair of Direct Current (DC) link voltage rails, said magnetic bearing drive circuit having at least one amplifier providing an output Pulse Width Modulation (PWM) drive signal for driving a magnetic bearing winding, said output PWM drive signal being provided to the magnetic bearing winding through a plurality of drive signal rails, said magnetic bearing drive circuit comprising:
   a pair of voltage offset devices coupled to the DC link voltage rails and arranged to provide a pair of offset catcher voltage rails from the DC link voltage rails; and
   primary clamping circuitry coupled between each offset catcher voltage rail and a respective one of the drive signal rails.

2. The magnetic bearing drive circuit of claim 1, wherein each voltage offset device further comprises a decoupling capacitor network connected between earth and each offset catcher voltage rail.

3. The magnetic bearing drive circuit of claim 1, wherein the primary clamping circuitry comprises a pair of clamping diodes per respective drive signal rail.

4. The magnetic bearing drive circuit of claim 3, wherein the pair of primary clamping diodes are coupled in series between the offset catcher voltage rails, and the junction between the primary clamping diodes is coupled to the respective drive signal rail.

5. The magnetic bearing drive circuit of claim 1, wherein the voltage offset device comprises:
   a series resistor coupled between the respective DC link voltage rail and offset catcher voltage rail; or
   a (power) Zener diode having a predetermined threshold voltage coupled between the respective DC link voltage rail and offset catcher voltage rail; or
   a DC-DC converter, whose output is the DC link voltage between the DC link voltage rails and whose input is a predetermined offset voltage, coupled between the respective DC link voltage rail and both offset catcher voltage rails; or
   a capacitor, resistor and switch forming a brake circuit.

6. The magnetic bearing drive circuit of claim 5, wherein the voltage offset device comprises a Zener diode, and the circuit further comprises a resistor in series with each Zener diode.

7. The magnetic bearing drive circuit of claim 5, wherein the voltage offset device comprises a power Zener diode formed from a low power Zener diode coupled across a power Metal Oxide Semiconductor Field-Effect Transistor (MOSFET) or power insulated Gate Bipolar Transistor (IGBT).

8. The magnetic bearing drive circuit of claim 7, wherein the power Zener diode comprises a plurality of low power Zener diodes selectively coupled across a power MOSFET or power IGBT, to provide a variable threshold voltage power Zener diode.

9. The magnetic bearing drive circuit of claim 1, further comprising rectifier diodes coupled between the voltage offset devices and the DC link voltage rails to ensure power only transfers back to the DC link voltage.

10. The magnetic bearing drive circuit of claim 1, wherein the voltage offset devices are positioned:
    at the amplifier end of the overall system comprising the magnetic bearing, magnetic bearing amplifier and length of cables there between; or
    at the magnetic bearing end of the overall system comprising the magnetic bearing, magnetic bearing amplifier and length of cables there between.

11. The magnetic bearing drive circuit of claim 1, further comprising secondary clamping circuitry coupled between each DC link voltage rail and drive signal rail.

12. The magnetic bearing drive circuit of claim 11, wherein the secondary clamping circuitry comprises a further set of (power) diodes in series with resistors coupled between each DC link voltage rail and drive signal rail.

* * * * *